(12) United States Patent
Huster et al.

(10) Patent No.: US 6,426,279 B1
(45) Date of Patent: Jul. 30, 2002

(54) EPITAXIAL DELTA DOPING FOR RETROGRADE CHANNEL PROFILE

(75) Inventors: Carl Huster, San Jose; Emi Ishida, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 35 days.

(21) Appl. No.: 09/598,911

(22) Filed: Jun. 22, 2000

Related U.S. Application Data

(60) Provisional application No. 60/149,424, filed on Aug. 18, 1999.

(51) Int. Cl.$^7$ ............................................. H01L 21/425
(52) U.S. Cl. ...................................... 438/528; 438/291
(58) Field of Search ................................. 438/177, 280, 438/282, 289, 291, 480, 481, 527, 528

(56) References Cited

U.S. PATENT DOCUMENTS 5,514,902 A * 5/1996 Kawasaki et al. .......... 257/607
5,548,143 A * 8/1996 Lee ............................. 257/269
5,726,488 A   3/1998 Watanabe et al.
6,225,151 B1 * 5/2001 Gardner et al. ............. 438/162
6,271,551 B1 * 8/2001 Schmitz et al. ............. 257/288

* cited by examiner

*Primary Examiner*—John F. Niebling
*Assistant Examiner*—Christopher Lattin

(57) ABSTRACT

A semiconductor device exhibiting a super-steep retrograde channel profile to reduce susceptibility to "latch up" is achieved by forming a high impurity concentration layer on a semiconductor substrate and forming a diffusion cap layer near the surface of the high impurity concentration layer. Subsequently, a low impurity concentration layer is formed on the diffusion cap layer of the high impurity concentration layer. The diffusion cap layer formed between the high and low impurity concentration layers substantially prevents the impurities contained in the high impurity concentration layer from diffusing into the overlying low impurity concentration layer, thereby achieving a super-steep retrograde channel profile.

11 Claims, 4 Drawing Sheets

US 6,426,279 B1

EPITAXIAL DELTA DOPING FOR RETROGRADE CHANNEL PROFILE

RELATED APPLICATIONS

This application claims priority from U.S. Provisional Application Serial No. 60/149,424, filed Aug. 18, 1999, incorporated herein by reference.

FIELD OF THE INVENTION

The present invention relates to semiconductor devices and manufacturing process, and more particularly to methods for forming retrograde channel profiles within a semiconductor devices.

BACKGROUND ART

The principal elements of a typical metal-oxide-semiconductor (MOS) device generally comprise a semiconductor substrate on which a gate electrode is disposed. The gate electrode is typically a heavily doped polysilicon semiconductor. Heavily doped source/drain regions are formed in the semiconductor substrate and are connected to source/drain terminals. A channel region is formed in the semiconductor substrate beneath the gate electrode and separates the source/drain regions. The gate electrode is generally separated from the semiconductor substrate by an insulating layer to prevent current from flowing between the gate electrode and the source/drain regions or channel regions.

In operation, an output voltage is typically developed between the source and drain terminals. When an input voltage is applied to the gate electrode, a transverse electrical field is set up in the channel region. By varying the transverse electric field between the source and drain regions, it is possible to modulate the conductance of the channel region between the source and drain regions. In this manner, an electric field controls the current flow through the channel region. The channel is typically lightly doped with an impurity type opposite to that of the source/drain regions, and the impurity concentration profile is typically uniform from the surface toward the direction of depth, as shown by line a in FIG. 3.

In particular MOSFET devices, a channel implantation process is frequently performed to augment the substrate doping of the same conductivity. Thus, for an NMOS device, a p-type impurity is ion implanted into the substrate and channel region, and for a PMOS device, an n-type impurity is ion implanted into the substrate and channel region. The purposes of this channel implantation are typically to adjust threshold voltages and improve short channel characteristics, and many approaches have been introduced, such as a retrograde well structure for that purposes. As shown by curve b in FIG. 3, the retrograde well structure generally has an impurity concentration peak deep under the surface. A method for manufacturing a retrograde well structure in semiconductor devices is disclosed in U.S. Pat. No. 5,726,488 by Watanabe, et al. According to Watanabe, et al., a retrograde well structure is achieved by forming an epitaxial layer on a semiconductor substrate having a highly doped boron layer, formed by ion implantation, in its surface. As shown in FIG. 1A, a lightly doped P type silicon substrate 10 is prepared and the first oxide film 12 is formed thereon. A first photoresist layer 14 is formed on the first oxide film 12. In FIG. 1B, after patterning the first photoresist layer 14 to expose a portion of the top surface of the first oxide film 12, boron is ion implanted, as shown by arrows A, into the first oxide film 12 at an implantation dosage of between $5 \times 10^{12}$ atoms $cm^{-2}$ to $2 \times 10^{13}$ atoms $cm^{-2}$ and at an implantation energy of 50 KeV, thereby forming a high concentration layer 16 in the surface of the substrate 10. As shown in FIG. 1C, after removing the first photoresist layer 14 and the first oxide film 12, an epitaxial layer 18 is formed on the substrate 10 including the high concentration layer 16 at a thickness of between 0.8 $\mu$m to 1.7 $\mu$m. Then, as shown in FIG. 1D, a second oxide film 20 is formed on the epitaxial layer 18, and a nitride film 22 is formed on the second oxide film 22. A second photoresist layer 24 is formed on the nitride film 22. As shown in FIG. 1E, after patterning the second photoresist layer 24 and the nitride film 22 to expose a portion of the surface of the epitaxial layer 18 overlying the high concentration layer 16, $BF_2$ ions are implanted, as shown by arrows B, into the second oxide film 20 at an implantation dosage of $2 \times 10^{12}$ atoms $cm^{-2}$ and an implantation energy of 60 KeV, thereby forming a low impurity region 26 within the epitaxial layer 18. As shown in FIG. 1F, after removing the second oxide film 20, the nitride film 22, and the second photoresist layer 24 from the top surface of the epitaxial layer 18, an annealing process is performed to repair the lattice damage by the previous ion implantation. A gate oxide layer 28 is then formed on the low impurity region 26, and local isolation regions 29 are formed on the epitaxial layer 18. In FIG. 1G, a gate electrode 30 is formed on the gate oxide 28 with sidewall spacers 32. Then, n-type active regions 34 are formed by ion implanting arsenic ions at an implantation dosage of $3 \times 10^{16}$ $cm^{-2}$ and at an implantation energy of 80 KeV.

Although the method disclosed in Watanabe et al. provides a relatively simple method to form a retrograde channel profile, the implanted boron atoms contained in the high concentration layer 16 are easily diffused into the overlying epitaxial layer 18 by the subsequent fabrication steps e.g., annealing, thereby degrading the carrier mobility of the channel region and the channel inversion charge density.

Thus, there is a continuing need for improved methods that form a super-steep retrograde impurity profile to improve the channel carrier mobility and the channel inversion charge density, thereby improving devices' speed performance.

SUMMARY OF THE INVENTION

An advantage of the present invention is an efficient and production-worthy method of manufacturing a semiconductor device having a retrograde channel profile to improve devices' speed performance.

Another advantage of the present invention is a simplified and improved method of manufacturing a super steep retrograde channel profile.

Additional advantages and other features of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other advantages are achieved in part by a method of manufacturing a semiconductor device, which method comprises: forming a high impurity concentration layer of a first conductive type on a main surface of a semiconductor substrate; introducing a non-dopant into the high concentration impurity layer to form a diffusion cap layer near a top surface of the high concentration impurity layer; and forming a low impurity concentration layer of the first conductive type on the surface of the first semiconductor layer. The diffusion cap layer formed between the high impurity concentration layer and the low impurity concentration layer substantially prevents impurity atoms contained in the high concentration layer from diffusing into the low impurity concentration layer.

Another aspect of the present invention is a semiconductor device comprising: a silicon substrate having a main surface; a high impurity concentration layer of a first conductive type formed on the main surface of the silicon substrate, the high impurity concentration layer comprising a diffusion cap layer formed near a top surface of the high impurity concentration layer; and a low impurity concentration layer of the first conductive type formed on the top surface of the high impurity concentration layer.

Additional advantages of the present invention will become readily apparent to those skilled in the art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not restrictive.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENT

The present invention solves problems associated with the formation of a retrograde channel profile within semiconductor devices. Specifically, the present invention enables the formation of a super steep retrograde channel profile by forming a diffusion cap layer between a high concentration impurity layer and its overlying low concentration impurity layer. The diffusion cap layer prevents diffusion of impurity atoms contained in the high concentration impurity layer into the overlying low concentration impurity layer, thereby achieving a super-steep retrograde channel profile.

The super-steep retrograde channel profile significantly increase the channel carrier mobility and decrease the channel inversion charge density, thereby improving devices' speed performance. Consequently, the super-steep retrograde channel formed in accordance with the present invention advantageously provides a more reliable and durable semiconductor device, and further provides a simpler process that is repeatable and better process control over the retrograde channel doping processes.

Figure 1A:
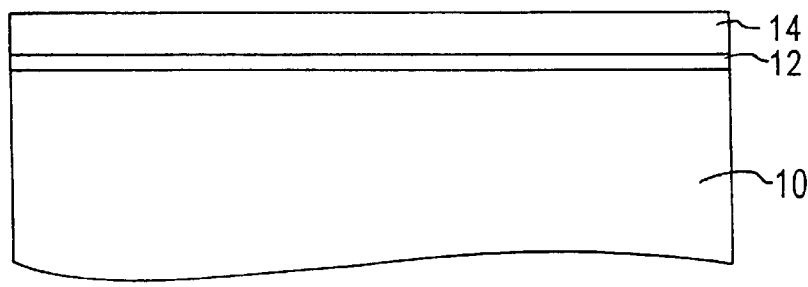
FIG. 1A to FIG. 1G depict sequential phases of a prior art method.
Figure 1B:
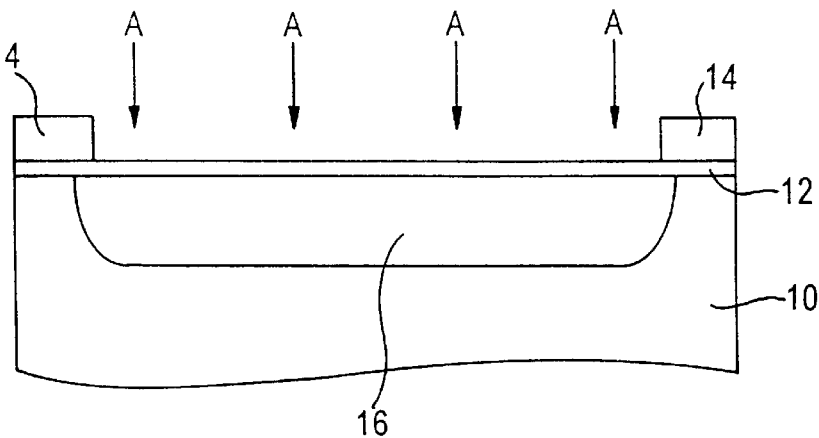
Figure 1C:
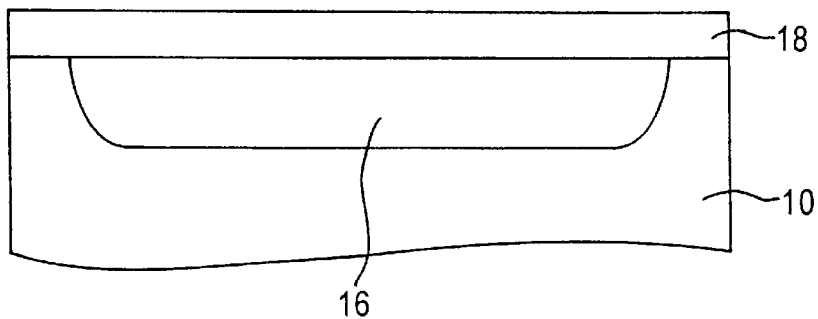
Figure 1D:
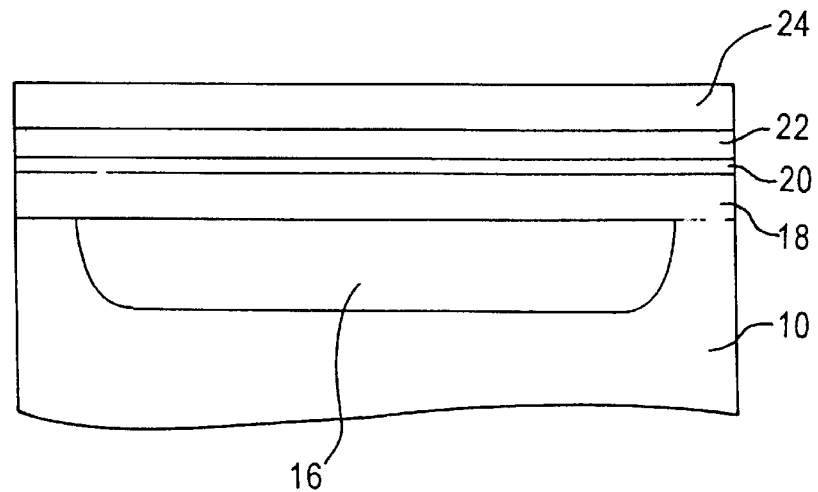
Figure 1E:
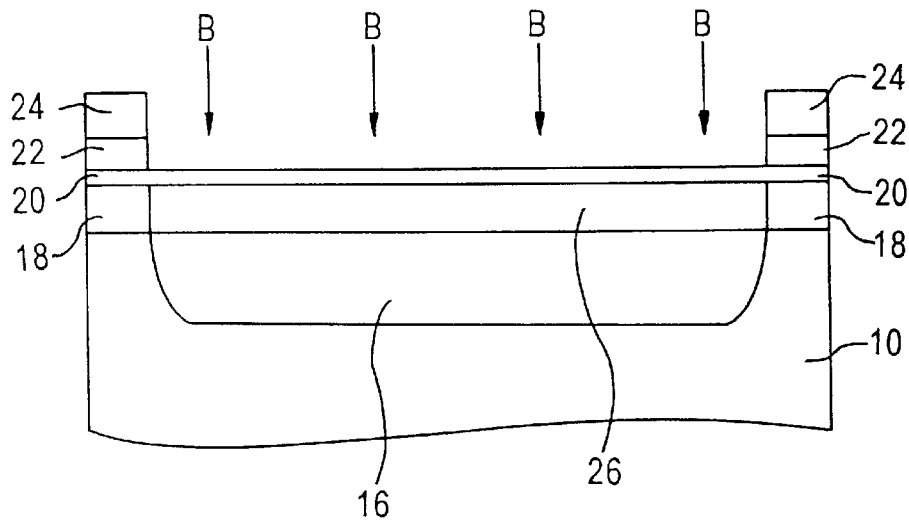
Figure 1F:
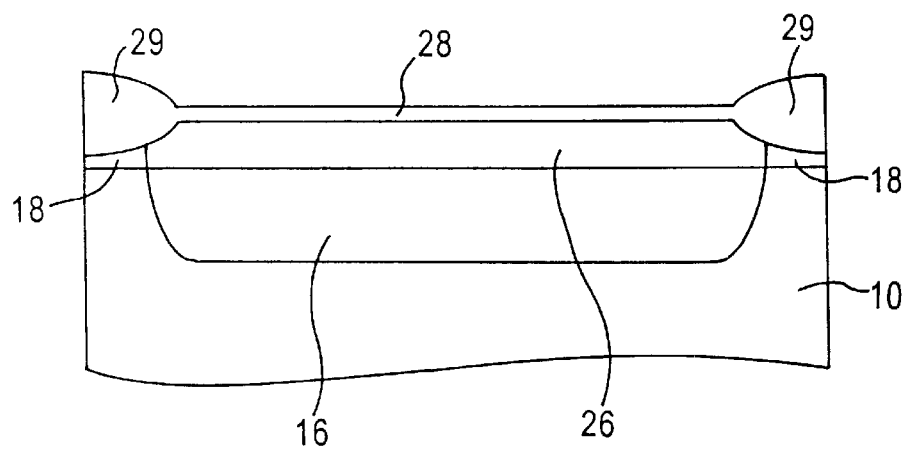
Figure 1G:
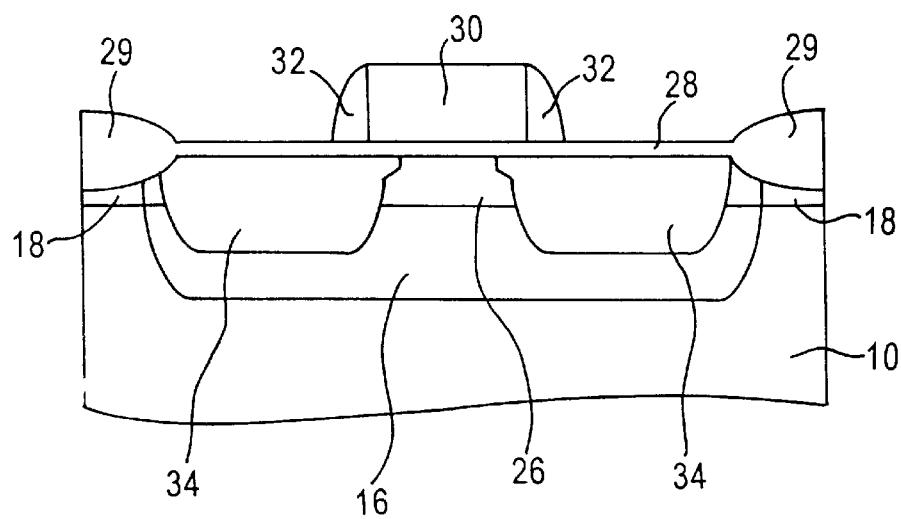
Figure 2A:
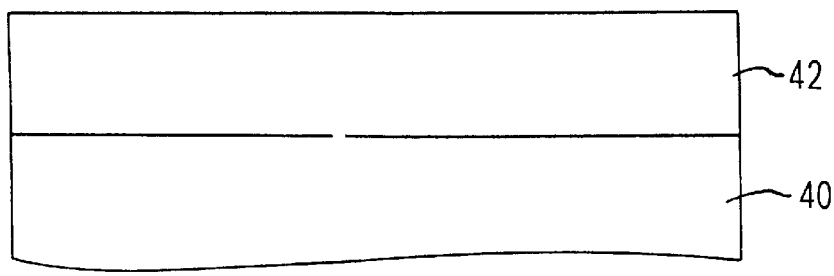
FIG. 2A to FIG. 2D depict sequential phases of a method according to an embodiment of the present invention.

FIG. 2A illustrates a cross-sectional view of a semiconductor device being fabricated in accordance with the present invention. A semiconductor substrate 40, normally doped monocrystalline silicon in accordance with conventional practices, is prepared. Then, a high impurity concentration layer 42 containing an impurity, e.g., a P type impurity for an NMOS device, is formed on the substrate 40. In an embodiment of the present invention, the high impurity concentration layer 42 is formed by ion implanting impurity, e.g., boron for an NMOS device or phosphorous for a PMOS device, on the substrate 40. For example, the high impurity concentration layer 42 is formed by ion implanting boron at an impurity concentration of between about $5 \times 10^{12}$ atoms $cm^{-2}$ to about $5 \times 10^{-}$ atoms cm at an implantation energy of between 10 KeV to about 30 KeV, to form the high impurity concentration layer 42 having an impurity concentration of between about $1 \times 10^{17}$ atoms $cm^{-3}$ to about $1 \times 10^{18}$ atoms $cm^{-3}$, and having a thickness of between about 200 Å to about 1000 Å.

Figure 2B:
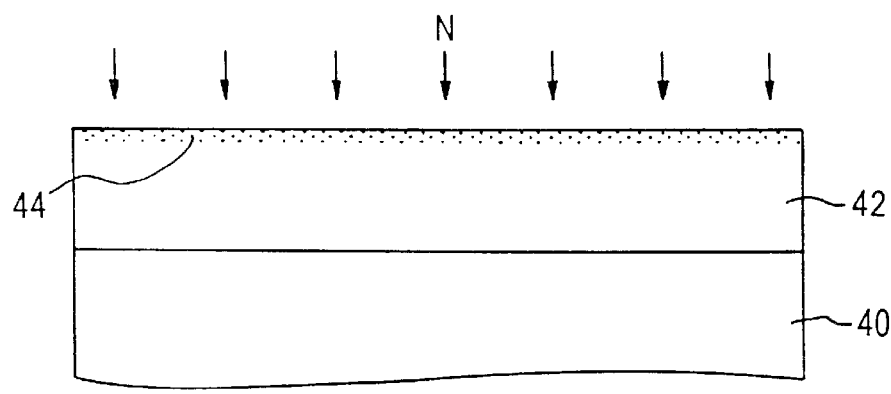

Subsequently, nitrogen or carbon is introduced into the high impurity concentration layer 42, as shown in FIG. 2B, to form a diffusion cap layer 44 near the top surface of the high impurity concentration layer 42. In an embodiment of the present invention, the diffusion cap layer 44 is formed by ion implanting nitrogen or carbon into the high impurity concentration layer 42 at an impurity concentration of between about $1 \times 10^{17}$ atoms $cm^{-2}$ to about $1 \times 10^{19}$ atoms $cm^{-2}$ and at an implantation energy of about 0.1 KeV to about 5 KeV.

Figure 2C:
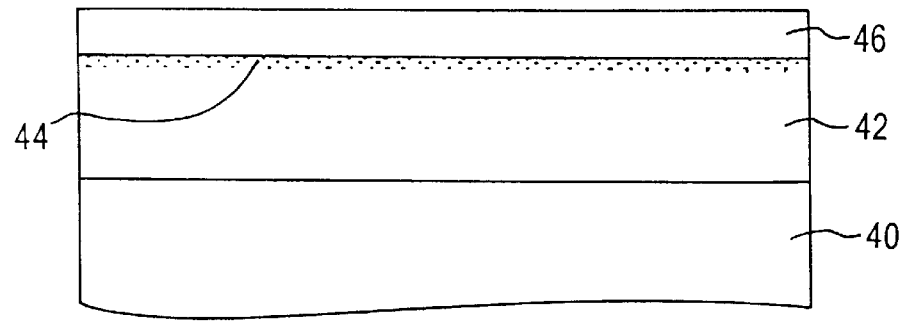

A low impurity concentration layer 46 is then formed on the high impurity concentration layer 42 and the diffusion cap layer 44, as shown in FIG. 2C. In an embodiment of the present invention, the low impurity concentration layer 46 is formed by growing a silicon epitaxial layer, containing the same conductive type impurity as the high impurity concentration region 42, e.g., boron for an NMOS device or phosphorous for a PMOS device, by low pressure chemical vapor deposition (LPCVD) at a thickness of between about 20 Å to about 200 Å. The low impurity concentration layer 46 is a lightly doped silicon epitaxial layer, formed by low pressure chemical vapor deposition (LPCVD), containing boron at an impurity concentration of between about $1 \times 10^{16}$ atoms $cm^{-3}$ to about $1 \times 10^{18}$ atoms $cm^{-3}$.

Figure 2D:
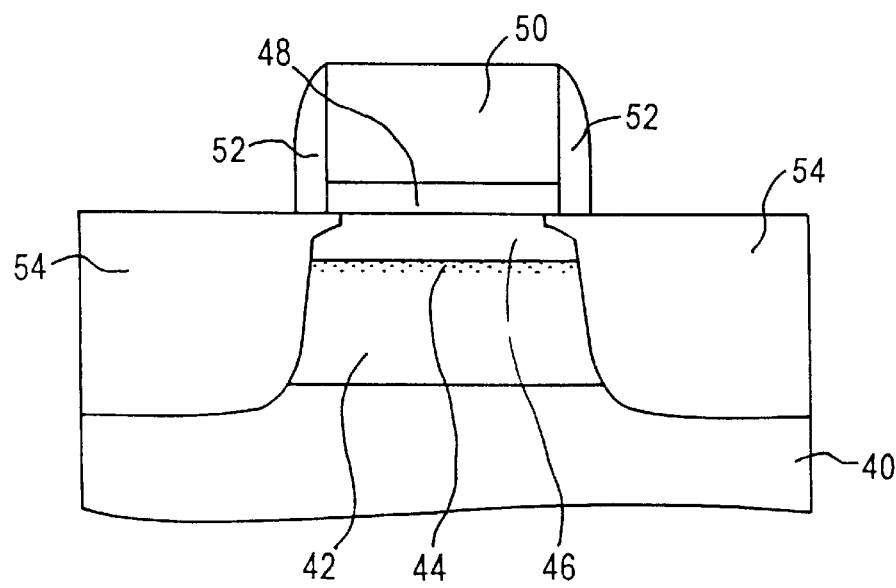

As shown in FIG. 2D, embodiments of the present invention further comprise: forming a gate electrode 50 on the top surface of the low impurity concentration layer 46 with a gate dielectric layer 48 therebetween; ion implanting impurity atoms of the opposite type to the high and low impurity concentration layers 42, 46 to form source and drain regions 54; and forming sidewall spacers 48 on the side surfaces of the gate dielectric layer 48 and gate electrode 50.

Figure 3:
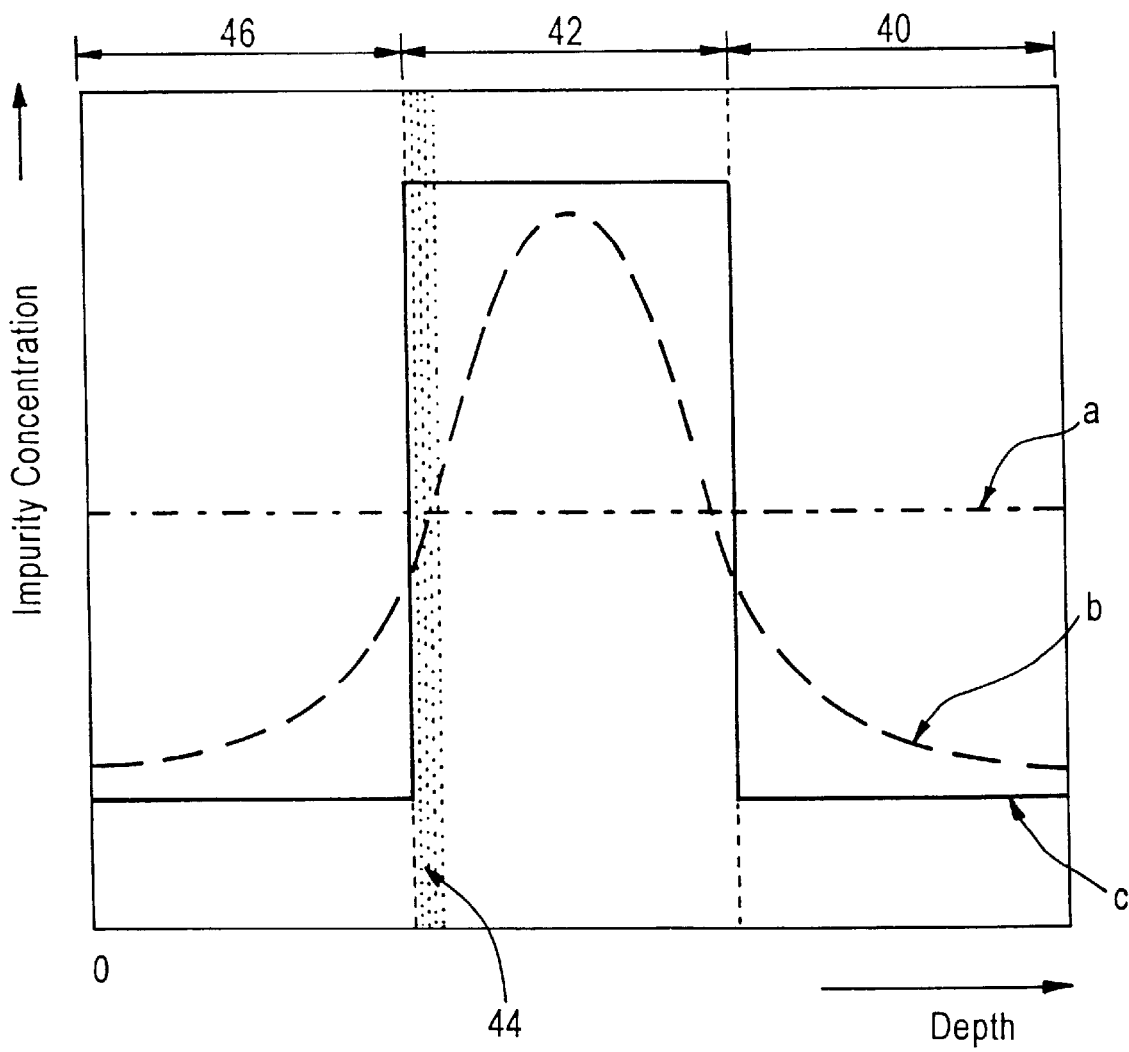
FIG. 3 depicts channel impurity profiles in accordance with prior art methods and the present invention.

The diffusion cap layer 44 formed between the high and low impurity concentration layer 42, 46 substantially prevents the impurity contained in the high impurity concentration layer 42 from diffusing into the overlying low impurity concentration layer 46, and therefore a super-steep retrograde channel profile is achieved, as shown by line c of FIG. 3. Such a super steep retrograde channel profile significantly increases $I_{Don}$ due to the improved channel carrier mobility and channel inversion charge density.

An embodiment of a structure in accordance with the present invention is schematically illustrated in FIG. 2D and comprises a high impurity concentration impurity layer 42, containing an impurity of a first conductive type, e.g., a P-type impurity for an NMOS device, located on the surface of the semiconductor substrate 40. In an embodiment of the present invention, the high impurity concentration layer 42 is an epitaxial layer having a thickness of between about 100

Å to about 1000 Å, and having a substantially constant impurity concentration of between about $5\times10^{17}$ atoms cm$^{-3}$ to about $5\times10^{19}$ atoms cm$^{-3}$. The high impurity concentration layer 42 comprises a diffusion cap layer 44 which is formed near the top surface of the high concentration impurity layer 42. A low impurity concentration layer 46 is located on the diffusion cap layer 44 of the high impurity concentration layer 42. The low impurity concentration layer 46 contains impurity atoms of the same conductive type as the high impurity concentration layer 42 but at a substantially smaller impurity concentration of between about $5\times10^{16}$ atoms cm$^{-3}$ to about $5\times10^{17}$ atoms cm$^{-3}$. The low impurity concentration layer 46 is an epitaxial layer having a thickness of between about 20 Å to about 200 Å. The diffusion cap layer 44 formed between the high and low impurity concentration layer 42, 46 substantially prevents impurity atoms contained in the high impurity concentration layer 42 from diffusing into the low impurity concentration layer 46. Accordingly, a super-steep retrograde channel profile is achieved.

Embodiments of the present invention involve the use of conventional materials and methodologies to form various components of a transistor and semiconductor device. For example, the semiconductor substrate employed in the embodiments of the present invention typically comprises monocrystalline silicon.

In the previous description, numerous specific details are set forth such as specific material, structure, chemicals, process, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and a few examples of its versatility are shown and described in the present disclosure. It is to be understood that the present invention is capable of use in various other combinations and environments and is capable of changes or modifications within the scope of the inventive concept as expresses herein.

What is claimed is:

1. A method for manufacturing a semiconductor device, the method comprising:

forming a high impurity concentration layer of a first conductive type on a main surface of a semiconductor substrate;

introducing a non-dopant into the high concentration impurity layer to form a diffusion cap layer near a top surface of the high concentration impurity layer; and forming a low impurity concentration layer of the first conductive type on the surface of the diffusion cap layer, wherein the diffusion cap layer formed between the high impurity concentration layer and low impurity concentration layer substantially prevents impurity atoms contained in the high concentration layer from diffusing into the low impurity concentration layer.

2. The method according to claim 1, wherein the step of introducing a non-dopant includes ion implanting at least one of nitrogen and carbon into the top surface of the high concentration impurity layer to form the diffusion cap layer.

3. The method according to claim 2, wherein the nitrogen or carbon is ion implanted at an impurity concentration of between about $1\times10^{16}$ atoms cm$^{-2}$ to about $1\times10^{19}$ atoms cm$^{-2}$ and at an implantation energy of about 0.1 KeV to about 10 KeV, to form the diffusion cap layer.

4. The method according to claim 1, wherein the high impurity concentration layer and the low impurity concentration layer comprise impurities of boron, phosphorus, arsenic, indium, or antimony.

5. The method according to claim 4, wherein the steps of forming the high impurity concentration layer includes the step of ion implanting an impurity of the first conductive type into the main surface of the substrate.

6. The method according to claim 5, wherein the steps of ion implanting include ion implanting boron at an impurity concentration of between about $5\times10^{12}$ atoms cm$^{-2}$ to about $5\times10^{13}$ atoms cm$^{-2}$ at an implantation energy of between about 10 KeV to about 30 KeV.

7. The method according to claim 6, wherein the high impurity concentration layer has an impurity concentration of between about $5\times10^{17}$ atoms cm$^{-3}$ to about $5\times10^{18}$ atoms cm$^{-3}$.

8. The method according to claim 7, wherein the high impurity concentration layer has a thickness of between about 100 Å to about 1000 Å.

9. The method according to claim 4, wherein the step of forming the low impurity concentration layer includes growing an epitaxial layer.

10. The method according to claim 9, wherein the step of growing the epitaxial layers include depositing the epitaxial layer by lower pressure chemical vapor deposition (LPCVD).

11. The method according to claim 4, wherein the high impurity concentration layer has an impurity concentration of between about $5\times10^{16}$ atoms cm$^{-3}$ to about $5\times10^{17}$ atoms cm$^{-3}$ and a thickness of between about 20 Å to about 200 Å.

* * * * *